(12) United States Patent
Hecht et al.

(10) Patent No.: US 11,936,506 B2
(45) Date of Patent: Mar. 19, 2024

(54) TRANSMISSION OF A VALUE BY MEANS OF A PULSE-WIDTH-MODULATED SIGNAL

(71) Applicant: ZF CV SYSTEMS HANNOVER GMBH, Hannover (DE)

(72) Inventors: Christian Hecht, Wunstorf (DE); Dirk Müntefering, Wedemark (DE); Tobias Wurmbäck, Ronnenberg (DE)

(73) Assignee: ZF CV SYSTEMS HANNOVER GMBH, Hannover (DE)

( * ) Notice: Subject to any disclaimer, the term of this patent is extended or adjusted under 35 U.S.C. 154(b) by 287 days.

(21) Appl. No.: 17/434,583

(22) PCT Filed: Feb. 17, 2020

(86) PCT No.: PCT/EP2020/054052
§ 371 (c)(1),
(2) Date: Aug. 27, 2021

(87) PCT Pub. No.: WO2020/173733
PCT Pub. Date: Sep. 3, 2020

(65) Prior Publication Data
US 2022/0141059 A1    May 5, 2022

(30) Foreign Application Priority Data
Feb. 27, 2019    (DE) .......... 10 2019 104 955

(51) Int. Cl.
*H02P 27/08*    (2006.01)
*H03K 5/19*    (2006.01)
(Continued)

(52) U.S. Cl.
CPC .......... *H04L 25/4902* (2013.01); *H02P 27/08* (2013.01); *H03K 5/19* (2013.01); *H03K 7/08* (2013.01)

(58) Field of Classification Search
CPC ... B60T 7/04; B60T 17/22; H02P 8/14; H02P 27/06; H02P 27/08; H03K 5/19;
(Continued)

(56) References Cited

U.S. PATENT DOCUMENTS

| | | | |
|---|---|---|---|
| 2009/0046773 A1* | 2/2009 | Scherr | H04L 7/044 375/238 |
| 2015/0176962 A1 | 6/2015 | Kerdraon et al. | |

(Continued)

FOREIGN PATENT DOCUMENTS

| | | |
|---|---|---|
| DE | 102010029847 A1 | 2/2011 |
| DE | 102006017302 B4 | 2/2012 |

(Continued)

OTHER PUBLICATIONS

English translation of International Search Report for PCT/EP2020/054052 dated May 25, 2020, 2 pages.

(Continued)

*Primary Examiner* — Shawkat M Ali
(74) *Attorney, Agent, or Firm* — WARNER NORCROSS + JUDD LLP

(57) ABSTRACT

A system for transmitting a value via a pulse-width-modulated signal, comprises a transmitter and a receiver. The transmitter is configured for detecting the value and for outputting a pulse-width-modulated signal having a pulse width which represents the value or a range around the value. The receiver is configured for deriving the value or the range from the pulse-width-modulated signal, by evaluating the pulse width. The transmitter is furthermore configured to read back the emitted pulse-width-modulated signal and to check whether the value or the range can be derived from the emitted pulse-width-modulated signal, and, if the value or the range cannot be derived, to output an error signal to the receiver.

8 Claims, 3 Drawing Sheets

(51) Int. Cl.
*H03K 7/08* (2006.01)
*H04L 25/49* (2006.01)

(58) Field of Classification Search
CPC .... H03K 7/08; H04L 7/00; H04L 7/04; H04L 7/033; H04L 25/49; H04L 25/4902; H04L 29/08
USPC ........ 375/219, 238, 260, 262, 267, 295, 316
See application file for complete search history.

(56) References Cited

U.S. PATENT DOCUMENTS

2016/0142071 A1* 5/2016 Hammerschmidt .... H03M 5/08
375/238
2017/0366336 A1 12/2017 Ditterich et al.

FOREIGN PATENT DOCUMENTS

EP 3029829 A1 6/2016
WO 199836956 A1 8/1998

OTHER PUBLICATIONS

Machine assisted English translation of WO199836956A1 obtained from https://patents.google.com/patent on Aug. 24, 2021, 10 pages.
Machine assisted English translation of DE102010029847A1 obtained from https://patents.google.com/patent on Aug. 24, 2021, 6 pages.
Machine assisted English translation of DE102006017302B4 obtained from https://patents.google.com/patent on Aug. 24, 2021, 8 pages.

* cited by examiner

TRANSMISSION OF A VALUE BY MEANS OF A PULSE-WIDTH-MODULATED SIGNAL

CROSS-REFERENCE TO RELATED APPLICATIONS

This application is the National Stage of International Application No. PCT/EP2020/054052, filed on 17 Feb. 2020, which claims priority to and all advantages of German Patent Application No. 10 2019 104 955.5, filed on 27 Feb. 2019, the contents of which are hereby incorporated by reference.

FIELD OF THE DISCLOSURE

The present invention relates to a system for transmitting a value by means of a pulse-width-modulated signal, and a corresponding method which may be carried out by the system.

BACKGROUND

Systems for transmitting values by means of pulse-width-modulated signals are known from the prior art, in which the value to be transmitted is represented by the pulse width of the pulses (see, for example, DE 10 2006 017 302 B4 and DE 10 2010 029 847 A1).

BRIEF SUMMARY

A system according to the present invention for transmitting a value by means of a pulse-width-modulated signal comprises a transmitter and a receiver, which are electrically interconnected via at least a signal line and a ground line. The transmitter is configured for detecting the value and for outputting a pulse-width-modulated signal having a pulse width which represents the value or a range around the value. The receiver is configured for deriving the value or the range from the emitted pulse-width-modulated signal, by evaluating the pulse width. The transmitter is furthermore configured to read back the emitted pulse-width-modulated signal and to check whether the value or the range can be derived from the emitted pulse-width-modulated signal, and, if the value or the range cannot be derived, to output an error signal to the receiver.

The term "value," as used in the description and the claims, is to be understood in particular to be a numerical value. Furthermore, the term "pulse-width-modulated signal," as used in the description and the claims, is to be understood to be, in particular, a sequence of transmission sequences in which a voltage embodying the signal alternates between two levels, wherein the duration during which a certain (constant) level is output is derived from the information which is to be transmitted and which is represented by the duration of one or several pulses. Furthermore, the term "error signal," as used in the description and the claims, is to be understood to be, in particular, a signal which is interpreted by the receiver as an invalid signal and from which no value or no range can be/is accordingly derived (by the receiver).

Outputting a pulse-width-modulated signal or an error signal is to be understood to mean that whenever a low level is output as the voltage embodying the signal, the signal line is connected to the ground line.

By reading back the emitted signal, i.e., by reading back the voltage from the signal line, disturbances acting on the emitted signal may be detected, and a use/forwarding of erroneous values or value ranges by the receiver may be prevented, thus increasing the reliability of the transmission. For example, the receiver may be configured to reject one or several values which are assumed to be valid, in response to an error signal, so that by outputting the error signal, the transmitter can prevent an erroneous value or value range from being used and/or forwarded.

The transmitter may furthermore be configured to output a pulse-width-modulated signal having a pulse width which is in a range accepted as valid by the transmitter and by the receiver, wherein the error signal is a pulse-width-modulated signal having a pulse width which is outside the range accepted as valid.

For example, the range accepted as valid for pulse widths may be a particular proportional duration of a transmission sequence, for example, a range between 10% and 90% of the duration of a transmission sequence. If, for example, a pulse having a pulse width of 85% (or 15%) is to be output, and the read-back pulse has a pulse width of 75% (or 25%) due to a disturbance, an (error signal with a) pulse having a pulse width of 95% (or 5%) may be output in response to the disturbance, in order to signal the transmission error to the receiver.

The transmitter may furthermore be configured to read back the emitted error signal and to check whether the error signal is a pulse-width-modulated signal having a pulse width which is outside the range accepted as valid.

For example, according to the above example, it may be provided that the error signal has a pulse width of 95% (or 5%) of the duration of a transmission sequence, whereas the read-back pulse has a smaller (or larger) pulse width due to the disturbance.

If the read-back error signal is a pulse-width-modulated signal having a pulse width which is within the range accepted as valid, the transmitter may furthermore be configured to modify the emitted error signal until the read-back, modified error signal is a pulse-width-modulated signal having a pulse width which is outside the range accepted as valid.

For example, according to the above example, due to the disturbance, the read-back pulse may have a pulse width of 90% (or 10%), which is interpreted by the receiver as a valid signal and not as an error signal, so that the transmitter further modifies the pulse width of the error signal, in order to enable a reliable reception of the error signal by the receiver, despite the disturbance.

The transmitter may furthermore be configured to output a pulse-width-modulated signal having a modulation frequency which is in a range which is accepted as valid by the transmitter and the receiver, wherein the error signal is a pulse-width-modulated signal having a modulation frequency which is outside the valid, accepted ranged.

For example, the length of the transmission sequences in which a pulse is respectively created may be modified (i.e., lengthened or shortened), so that a modified modulation frequency can be derived from the (increasing or decreasing) intervals between the pulse edges or pulse centers.

The transmitter may furthermore be configured to read back the emitted error signal and to check whether the error signal is a pulse-width-modulated signal having a modulation frequency which is outside the range accepted as valid.

For example, due to a disturbance, the read-back error signal may have an unmodified modulation frequency, so that the signal is interpreted by the receiver as a valid signal and not as an error signal. In this case, the transmitter may further modify the modulation frequency of the error signal, in order to force a reception of an error signal by the receiver, despite the disturbance. This modification may be carried out as long, or as often, as necessary, until it has been ensured that the receiver detects the error signal.

In other words, if the read-back error signal is a pulse-width-modulated signal having a modulation frequency which is within the range accepted as valid, the transmitter may furthermore be configured to modify the emitted error signal until the read-back, modified error signal is a pulse-width-modulated signal having a modulation frequency which is outside the range accepted as valid.

A method according to the present invention for transmitting a value by means of a pulse-width-modulated signal comprises outputting a pulse-width-modulated signal having a pulse width which represents the value or a range around the value, reading back the emitted pulse-width-modulated signal, checking whether the value or the range can be derived from the emitted pulse-width-modulated signal, and, if the value or the range cannot be derived, outputting an error signal.

The emitted pulse-width-modulated signal may be a pulse-width-modulated signal having a pulse width which is in a range accepted as valid by a receiver, and the error signal may be a pulse-width-modulated signal having a pulse width which is outside the range accepted as valid.

Furthermore, the emitted pulse-width-modulated signal may be a pulse-width-modulated signal having a modulation frequency which is in a range accepted as valid by the receiver, wherein the error signal is a pulse-width-modulated signal having a modulation frequency which is outside the range accepted as valid.

It is understood that all further features and advantages (of preferred embodiments) of the system according to the present invention may also be features and advantages (of preferred embodiments) of the method according to the present invention, which relates to a (possible) use of the system according to the present invention.

BRIEF DESCRIPTION OF DRAWINGS

The foregoing aspects and many of the attendant advantages will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

Figure 1:
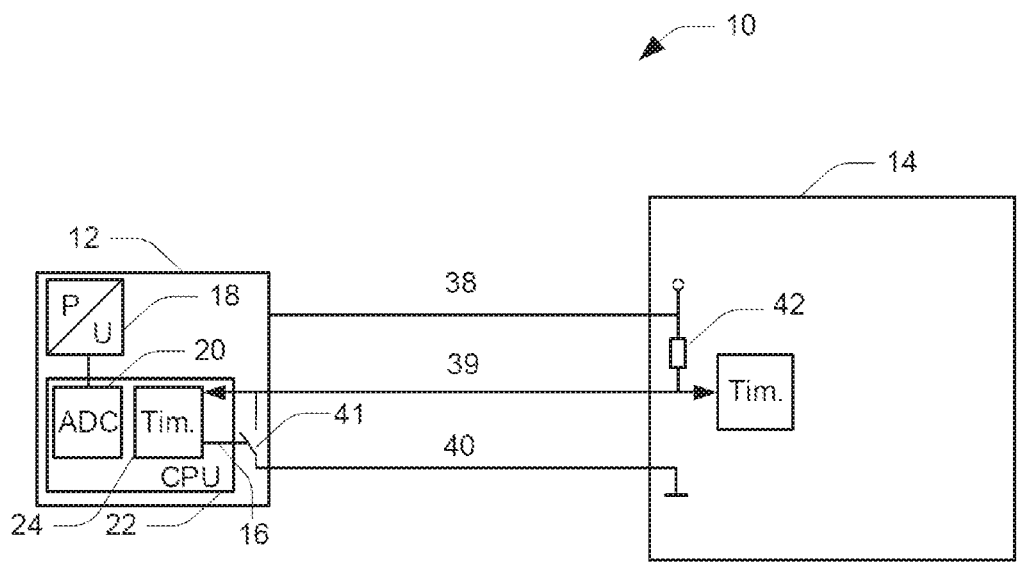
FIG. 1 depicts a schematic representation of a system according to the present invention.

In the drawing figures, identical and functionally similar elements are identified by identical reference signs. However, it is understood that all elements are not necessarily shown in all drawing figures, and that the depicted elements are intended only to illustrate aspects of the present invention.

Figure 2:
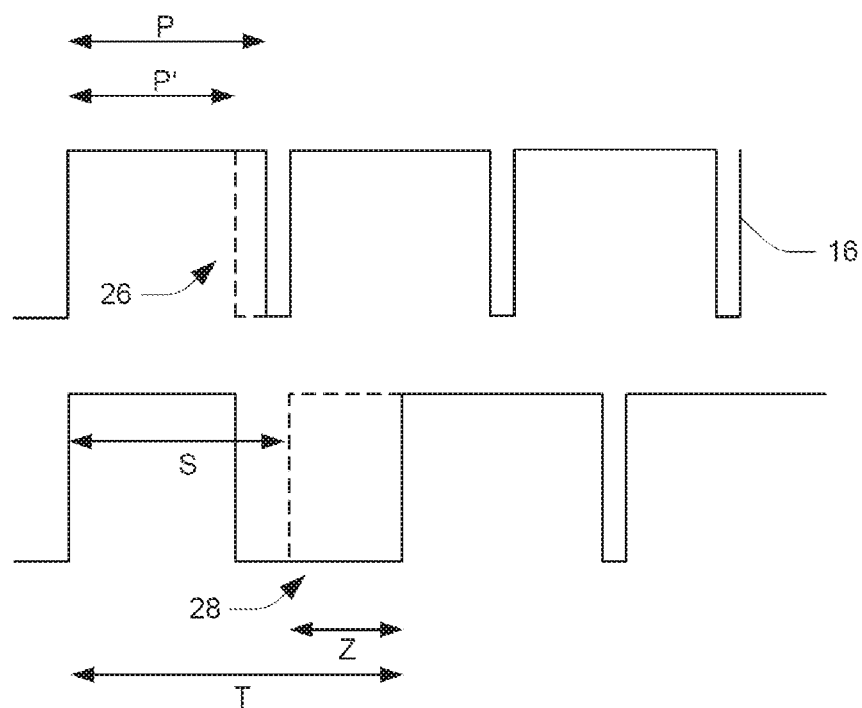
FIG. 2 depicts an erroneous transmission and an error signal caused thereby.

FIG. 1 and FIG. 2 illustrate the use of a system 10 according to the present invention for transmitting a value by means of a pulse-width-modulated signal 16. The system 10 comprises a transmitter 12 (for example, a sensor, in particular a brake signal sensor) and a receiver 14, which are electrically interconnected at least via a signal line 39 and to a ground line 40. Here, the transmitter 12 is also connected to the receiver 14 via a supply line 38 having a supply voltage. The transmitter 12 is configured to detect a value and to output a pulse-width-modulated signal 16 having a pulse width P which represents the value or a range around the value, by connecting the signal line 39 to the ground line 40 by means of the switch 41 whenever the pulse-width-modulated signal 16 has the low level.

For example, the transmitter 12 may comprise a transducer 18 which generates an analog voltage corresponding to the value or the value range. The analog voltage may then be converted by an analog/digital converter 20 (ADC) of a computing unit 22 (CPU) into a digital signal, on the basis of which a timer 24 generates the pulse-width-modulated signal 16 and outputs it by means of the switch 41. The receiver 14 is configured to derive the value or the value range from the voltage on the signal line 39 representing the emitted pulse-width-modulated signal 16, by evaluating the pulse width P, for example, by measuring the time between the signal edges.

In the receiver 14, the end of the signal line 39 there is connected to the end of the supply line 38 there via a first resistor 42. In the undisturbed case, the supply voltage is thus always present on the signal line when it is not connected to the ground line at the transmitter 12. In the case of disturbances, the voltage on the signal line 39 may deviate therefrom.

In order to be able to detect transmission errors due to disturbances which change the pulse width, the transmitter 12 is furthermore configured to read back the emitted pulse-width-modulated signal 16 by reading back the voltage on the signal line 39, and to check whether the value or the value range can be (reliably) derived from it. For example, because of a disturbance 26, an emitted pulse width P' may differ from the pulse width P to be output, so that the receiver 14 is not able to derive the value or the value range from the emitted pulse-width-modulated signal 16.

In order to prevent the receiver 14 from further processing or further transmitting an incorrect value or an incorrect value range, the transmitter 12 is configured to output an error signal 28 to the receiver 14. The error signal 28 is a signal which cannot be assigned to any (valid) value or value range by the receiver 14, and thus indicates an error (for example, an erroneous transmission) to the receiver 14.

As depicted in FIG. 2, the error signal 28 may, for example, be generated by extending a transmission sequence S=T−Z (a series of transmission sequences having the same duration) by a period of time Z. For example, during the time period Z, an inverted signal level (for example, a low level instead of a high level) may be emitted, whereby the modulation frequency changes in such a way that the receiver 14 detects a transmission error.

Figure 3:
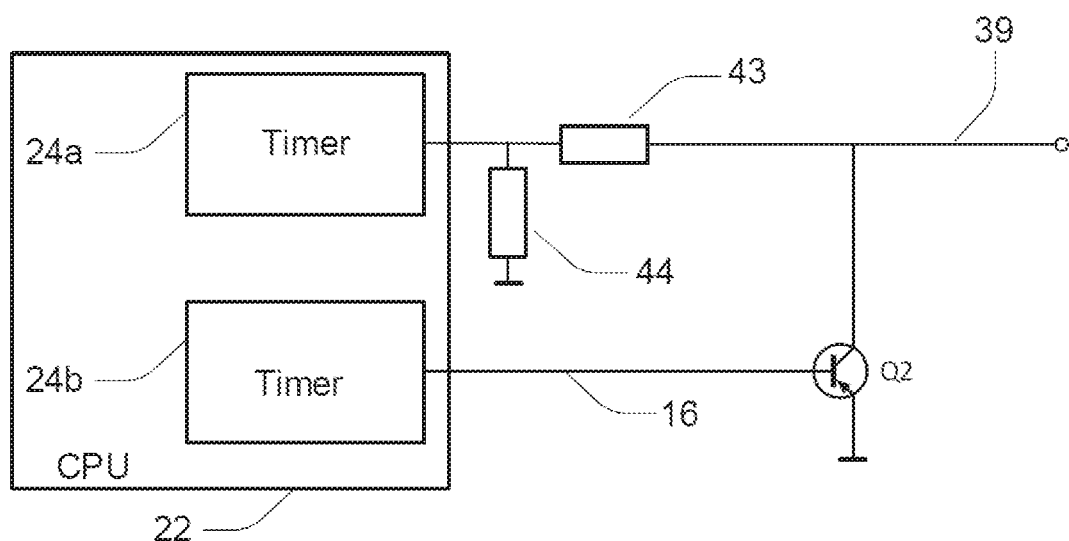
FIG. 3 depicts a schematic representation of elements of a system according to the present invention, according to an exemplary embodiment.

FIG. 3 displays a schematic representation of elements of a system 10 according to the present invention, according to one exemplary embodiment. In this figure, the computing unit 22 (CPU) comprises two timers 24a, 24b, wherein one timer 24b generates the pulse-width-modulated signal 16 and outputs it by activating a transistor Q2. The connection of the signal line 39 to the ground line 40, which occurs in the system depicted in FIG. 1 by means of the switch 41, is thus implemented here by means of the transistor Q2, which is brought into the on-state by means of suitable activation, and thus impresses the ground potential on the signal line 39.

The other timer 24a reads back the emitted signal (for example, a logic signal derived from the emitted signal) from the signal line 39 via the voltage divider made up of a second resistor 43 and a third resistor 44, detects the time periods between successive signal edges, and compares them to the pulse-width-modulated signal 16 to be output. It is understood that a separate timer 24a for reading back the emitted signal is optional, and the signal line 39 may also instead be sampled by the computing unit 22 (CPU) by means of a cyclical interrupt.

Figure 4:
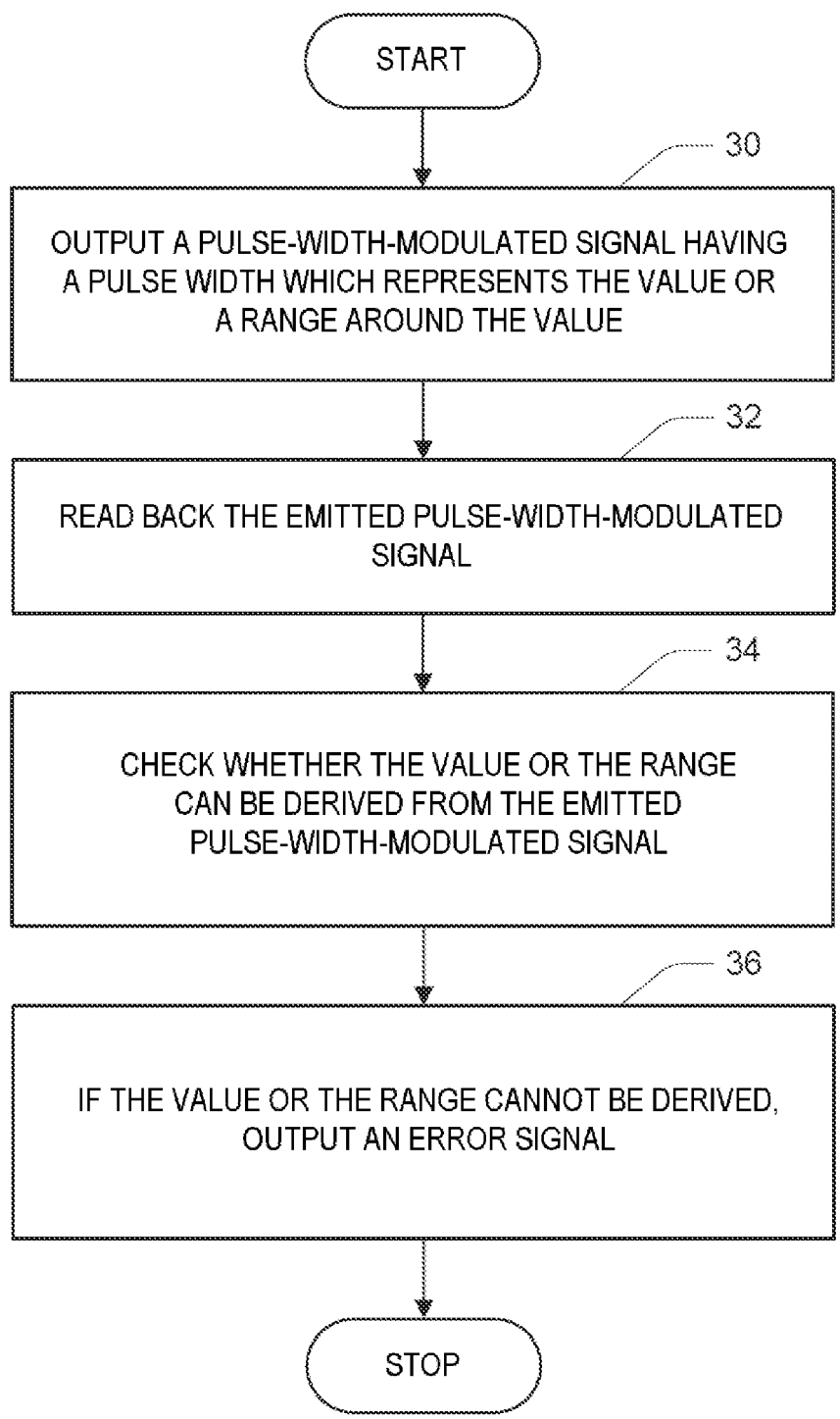
FIG. 4 depicts a flow chart of a method according to the present invention.

FIG. 4 depicts a flow chart of a method according to the present invention, which, for example, may be carried out by the system 10 according to the present invention. The method starts in step 30 with outputting a pulse-width-modulated signal 16 having a pulse width P which represents the value or a range around the value. For example, a pulse width P of 10% of a transmission sequence S may correspond to a minimum value, and a pulse width P of 90% of a transmission sequence S may correspond to a maximum value.

In step 32, the emitted pulse-width-modulated signal is read back in order to detect relevant transmission disturbances, i.e., deviations between the pulse-width-modulated signal 16 and the actually emitted pulse-width-modulated signal. Relevant transmission disturbances are not present, for example, if the value or the value range can be (reliably) derived from the emitted pulse-width-modulated signal, which is checked in step 34.

However, if the value or the range cannot be derived or cannot be derived reliably, in step 36, an error signal 28 is output to the receiver 14. The error signal 28 may be a signal which further modifies a disturbed transmission of a pulse-width-modulated signal 16, so that a disturbance of the transmission can be reliably detected on the receiver side.

Furthermore, by continuously reading back the emitted signals on the signal line 39, in addition to detecting the transmission disturbance 26, the error signal 28 emitted in response to the transmission disturbance 26 may also be checked and, if necessary, modified.

The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

LIST OF REFERENCE CHARACTERS

10 System
12 Transmitter
14 Receiver
16 Pulse-width-modulated signal
18 Transducer
20 Analog/digital converter
22 Computing unit
24 Timer
24a Timer
24b Timer
26 Disturbance
28 Error signal
30 Process step
32 Process step
34 Process step
36 Process step
38 Supply line
39 Signal line
40 Ground line
41 Switch
42 First resistor
43 Second resistor
44 Third resistor
P Pulse width
Q2 Transistor
S Transmission sequence
T Overlong transmission sequence
Z Extension time period

What is claimed is:

1. A system for transmitting a value via a pulse-width-modulated signal, said system comprising:
a transmitter configured to detect the value and output a first pulse-width-modulated signal having a first pulse width which represents the value or a range around the value, on a signal line; and
a receiver configured to derive the value or the range from a voltage on the signal line representing the outputted first pulse-width-modulated signal, by evaluating the first pulse width;
wherein the transmitter is configured to read back the outputted first pulse-width-modulated signal from the signal line and check whether the value or the range is capable of being derived from the outputted first pulse-width-modulated signal and, if the value or the range cannot be derived, output an error signal to the receiver; and wherein the transmitter is further configured to output a second pulse-width-modulated signal having a second pulse width which is in a range accepted as valid by the transmitter and the receiver, and wherein the error signal is a third pulse-width-modulated signal having a third pulse width which is outside the range accepted as valid.

2. The system as claimed in claim 1, wherein the transmitter is further configured to read back the outputted error signal from the signal line to check whether the outputted error signal is the third pulse-width-modulated signal having the third pulse width which is outside the range accepted as valid.

3. The system as claimed in claim 2, wherein, if a read-back error signal is the second pulse-width-modulated signal having the second pulse width which is within the range accepted as valid, the transmitter is further configured to modify the outputted error signal until the read-back, modified error signal is the third pulse-width-modulated signal having the third pulse width which lies outside the range accepted as valid.

4. The system as claimed in claim 1, wherein the transmitter is further configured to output a fourth pulse-width-modulated signal having a first modulation frequency which is in a range accepted as valid by the transmitter and the receiver, wherein the error signal is the third pulse-width-modulated signal having a second modulation frequency which is outside the range accepted as valid.

5. The system as claimed in claim 4, wherein the transmitter is further configured to read back the outputted error signal from the signal line and to check whether the outputted error signal is the third pulse-width-modulated signal having the second modulation frequency which is outside the range accepted as valid.

6. The system as claimed in claim 5, wherein, if a read-back error signal is the fourth pulse-width-modulated signal having the first modulation frequency which is within the range accepted as valid, the transmitter is further configured to modify the outputted error signal until the read-back, modified error signal is the third pulse-width-modulated signal having the second modulation frequency which is outside the range accepted as valid.

7. A method for transmitting a value by means of a pulse-width-modulated signal, said method comprising:
   outputting the pulse-width-modulated signal having a first pulse width which represents the value or a range around the value;
   reading back the outputted pulse-width-modulated signal;
   checking whether the value or the range is capable of being derived from the outputted pulse-width-modulated signal; and
   if the value or the range cannot be derived, outputting an error signal;
   wherein the outputted pulse-width-modulated signal is a first pulse-width-modulated signal having the first pulse width which is in a range accepted as valid by a receiver, and the error signal is a second pulse-width-modulated signal having a second pulse width which is outside the range accepted as valid.

8. The method as claimed in claim 7, wherein the outputted pulse-width-modulated signal has a first modulation frequency which is in a range accepted as valid by the receiver, wherein the error signal has a second modulation frequency which is outside the range accepted as valid.

* * * * *